(12) United States Patent
Liao et al.

(10) Patent No.: US 8,771,555 B2
(45) Date of Patent: Jul. 8, 2014

(54) INK COMPOSITION

(75) Inventors: Yueh-Chun Liao, Hsinchu (TW); Feng-Yu Yang, Hsinchu (TW); Ching Ting, Hsinchu (TW)

(73) Assignee: Neo Solar Power Corp., Hsinchu Science Park, Hsinchu (TW)

( * ) Notice: Subject to any disclaimer, the term of this patent is extended or adjusted under 35 U.S.C. 154(b) by 0 days.

(21) Appl. No.: 13/234,158

(22) Filed: Sep. 16, 2011

(65) Prior Publication Data

US 2012/0279420 A1    Nov. 8, 2012

Related U.S. Application Data

(60) Provisional application No. 61/483,062, filed on May 6, 2011.

(51) Int. Cl.
*H01B 1/02* (2006.01)

(52) U.S. Cl.
USPC ............. 252/518.1; 252/519.1; 252/519.14; 252/519.15; 252/519.2; 252/519.4; 252/519.5; 252/519.51; 252/520.1; 977/773; 977/775; 977/777

(58) Field of Classification Search
USPC .............. 252/518.1, 519.1, 519.14, 519.15, 252/519.2, 519.4, 519.5, 519.51, 520.1; 136/238, 239, 241; 977/773, 775, 777
See application file for complete search history.

(56) References Cited

U.S. PATENT DOCUMENTS

| | | | |
|---|---|---|---|
| 3,907,566 | A | 9/1975 | Inoue |
| 6,126,740 | A | 10/2000 | Schulz |
| 6,127,202 | A * | 10/2000 | Kapur et al. ............ 438/47 |
| 6,875,661 | B2 | 4/2005 | Mitzi |
| 7,094,651 | B2 | 8/2006 | Mitzi |
| 7,306,823 | B2 | 12/2007 | Sager |
| 7,494,841 | B2 | 2/2009 | Mitzi |
| 7,964,481 | B2 | 6/2011 | Mitzi |
| 8,168,090 | B2 | 5/2012 | Fujdala |
| 2004/0033345 | A1 | 2/2004 | Dubertret |
| 2006/0054506 | A1 | 3/2006 | Natan |
| 2007/0163644 | A1 | 7/2007 | Van Duren |
| 2008/0280030 | A1 | 11/2008 | Van Duren |
| 2009/0218550 | A1* | 9/2009 | Koyakutty et al. ......... 252/512 |
| 2009/0260670 | A1 | 10/2009 | Li |
| 2010/0096015 | A1 | 4/2010 | Robinson |
| 2010/0200043 | A1 | 8/2010 | Lombardo |
| 2010/0224247 | A1 | 9/2010 | Bartholomeusz |
| 2011/0034640 | A1 | 2/2011 | Fujdala |
| 2011/0076799 | A1 | 3/2011 | Calzia |
| 2011/0097496 | A1 | 4/2011 | Mitzi |
| 2011/0206599 | A1 | 8/2011 | Keszler |
| 2012/0061628 | A1 | 3/2012 | Johnson |
| 2012/0100661 | A1 | 4/2012 | Choe |
| 2012/0220066 | A1* | 8/2012 | Cao ............................. 438/73 |

FOREIGN PATENT DOCUMENTS

| | | |
|---|---|---|
| EP | 2 040 305 A2 | 3/2009 |
| EP | 2 305 600 A1 | 4/2011 |
| JP | H05175119 A | 7/1993 |
| JP | 2007269589 A | 10/2007 |
| JP | 200976842 A | 4/2009 |
| JP | 201188808 A | 5/2011 |
| JP | 2011176204 A | 9/2011 |
| TW | 201036175 | 10/2010 |
| TW | 201107241 | 3/2011 |
| WO | 2009137637 A2 | 11/2009 |
| WO | 2009137637 A3 | 11/2009 |
| WO | 2010135665 A1 | 11/2010 |
| WO | 2010135667 A1 | 11/2010 |
| WO | WO2011016283 A1 | 2/2011 |
| WO | 2011065994 A2 | 6/2011 |
| WO | WO2011066205 A1 | 6/2011 |
| WO | 2012000594 A1 | 1/2012 |

OTHER PUBLICATIONS

Optical and Photochemical Properties of Nonstoichiometric Cadmium Sulfide Nanoparticles: Surface Modification with Copper(II) Ions, Isarov et al, Langmuir, 1997, 13 (12), pp. 3142-3149.*
Compressibility of zinc sulfide nanoparticles, Gilbert et al., Physical Review B, vol. 74, Issue 11, id. 115405, 2006.*
The Zeta Potential, Colloidal Dynamics, 1999.*
Hironori Katagiri et al., "Preparation and evaluation of Cu2ZnSnS4 thin films by sulfurization of E-B evaporated precursors", 1997, pp. 407-414, Solar Energy Materials and Solar Cells 49.
Qijie Guo et al., "Synthesis of Cu2ZnSnS4 Nanocrystal Ink and Its Use for Solar Cells", Jul. 31, 2009, pp. 11672-11673, vol. 131, No. 33, J. Am. Chem. Soc. Communications.

(Continued)

*Primary Examiner* — Mark Kopec
*Assistant Examiner* — Haidung Nguyen
(74) *Attorney, Agent, or Firm* — Winston Hsu; Scott Margo

(57) ABSTRACT

An ink composition for forming a chalcogenide semiconductor film and a method for forming the same are disclosed. The ink composition includes a solvent, a plurality of metal chalcogenide nanoparticles and at least one selected from the group consisted of metal ions and metal complex ions. The metal ions and/or complex ions are distributed on the surface of the metal chalcogenide nanoparticles and adapted to disperse the metal chalcogenide nanoparticles in the solvent. The metals of the metal chalcogenide nanoparticles, the metal ions and the metal complex ions are selected from a group consisted of group I, group II, group III and group IV elements of periodic table and include all metal elements of a chalcogenide semiconductor material.

18 Claims, 13 Drawing Sheets

(56) References Cited

OTHER PUBLICATIONS

Joachim Paier et al., "Cu2ZnSnS4 as a potential photovoltaic material: A hybrid Hartree-Fock density functional theory study", Mar. 25, 2009, pp. 115126-1-115126-8, Physical Review B 79.

Qijie Guo et al., "Fabrication of 7.2% Efficient CZTSSe Solar Cells Using CZTS Nanocrystals", Nov. 19, 2010, pp. 17384-17386, vol. 132, No. 49, J. Am. Chem. Soc. Communications.

Shiyou Chen et al., "Intrinsic point defects and complexes in the quaternary kesterite semiconductor Cu2ZnSnS4", Jun. 8, 2010, pp. 245204-1-245204-10, Physical Review B 81.

Shiyou Chen et al., "Compositional dependence of structural and electronic properties of Cu2ZnSn(S,Se)4 alloys for thin film solar cells", Mar. 1, 2011, pp. 125201-1-125201-5, Physical Review B 83.

David B. Mitzi et al., "The path towards a high-performance solution-processed kesterite solar cell", Jan. 17, 2011, pp. 1421-1436, Solar Energy Materials & Solar Cells 95.

Shannon C. Riha et al., "Photoelectrochemical Characterization of Nanocrystalline Thin-Film Cu2ZnSnS4 Photocathodes", Dec. 31, 2010, pp. 58-66, vol. 3, No. 1, ACS Applied Materials & Interfaces.

Grayson M. Ford et al., "Earth Abundant Element Cu2Zn(Sn1-xGex)S4 Nanocrystals for Tunable Band Gap Solar Cells: 6.8% Efficient Device Fabrication", Apr. 28, 2011, pp. 2626-2629, Chemistry of Materials.

Tsuyoshi Maeda et al., "First Principles Calculations of Defect Formation in In-Free Photovoltaic Semiconductors Cu2ZnSnS4 and Cu2ZnSnSe4", Apr. 20, 2011, pp. 04DP07-1-04DP07-6, Japanese Journal of Applied Physics 50.

J.P. Leitão et al., "Study of optical and structural properties of Cu2ZnSnS4 thin films", Dec. 25, 2010, pp. 7390-7393, Thin Solid Films 519.

Xiuying Wang et al., "A facile and general approach to polynary semiconductor nanocrystals via a modified two-phase method", Apr. 21, 2011, cover page + pp. 1-8, Nanotechnology 22.

Wooseok Ki et al., "Earth-Abundant Element Photovoltaics Directly from Soluble Precursors with High Yield Using a Non-Toxic Solvent", Aug. 10, 2011, pp. 732-735, Advanced Energy Materials.

Mahaprasad Kar et al., "Formation Pathway of CuInSe2 Nanocrystals for Solar Cells", Sep. 1, 2011, pp. 17239-17247, Journal of the American Chemical Society.

A Nagoya et al., "Frist-principles study of Cu2ZnSnS4 and the related band offsets for photovoltaic applications", Sep. 19, 2011, cover page + pp. 1-6, Journal of Physics: Condensed Matter 23.

Manuel J. Romero et al., "Comparative study of the luminescence and intrinsic point defects in the kesterite Cu2ZnSnS4 and chalcopyrite Cu(In,Ga)Se2 thin films used in photovoltaic applications", Oct. 24, 2011, pp. 165324-1-165324-5, Physical Review B 84.

M. Bar et al., "Cliff-like conduction band offset and KCN-induced recombination barrier enhancement at the CdS/Cu2ZnSnS4 thin-film solar cell heterojunction", Nov. 29, 2011, cover page + pp. 222105-1-222105-3, Applied Physics Letters 99.

P.M.P. Salomé et al., "The influence of hydrogen in the incorporation of Zn during the growth of Cu2ZnSnS4 thin films", Aug. 26, 2011, pp. 3482-3489, Solar Energy Materials & Solar Cells 95.

Richard Haight et al., "Band alignment at the Cu2ZnSn(SxSe1-x)4/CdS interface", Jun. 21, 2011, cover page + pp. 253502-1-253502-3, Applied Physics Letters 98.

* cited by examiner

INK COMPOSITION

RELATED APPLICATIONS

This application claims the benefit of U.S. Provisional Application No. 61/483,062, filed May 6, 2011, titled "Method of making CZTS films and making related electronic devices" which is herein incorporated in its entirety by reference.

BACKGROUND

Photovoltaic devices recently have attracted attention due to energy shortage on Earth. The photovoltaic devices can be boldly classified into crystalline silicon solar cells and thin film solar cells. Crystalline silicon solar cells are the main stream photovoltaic device owing to its mature manufacturing technology and high efficiency. However, crystalline silicon solar cells are still far from common practice because its high material and manufacturing cost. Thin film solar cells are made by forming a light absorbing layer on a non-silicon substrate, such as glass substrate. Glass substrate has no shortage concern and the price thereof is cheaper as comparing with silicon wafers used in crystalline silicon solar cells. Therefore, thin film solar cells are considered as an alternative to crystalline silicon solar cells.

Thin film solar cells can be further classified by material of the light absorbing layers, such as amorphous silicon, multicrystalline silicon, Cadmium Telluride (CdTe), Copper indium gallium selenide (CIS or CIGS), Dye-sensitized film (DSC) and other organic films. Among these thin film solar cells, CIGS solar cell has reached cell efficiency of 20%, which is comparable with crystalline silicon solar cells.

The quaternary semiconductor $Cu_2ZnSn(S,Se)_4$ (CZTS), having a crystalline structure similar to CIGS, is a new photovoltaic material which attracts interests recently due to its low cost natural abundant and non-toxic elements. Conventional methods for forming CZTS films are processed under vacuum environment. It is reported that Ito and Nakazawa prepared CZTS thin films on a stainless steel substrate by atom beam sputtering. Friedl Meier et al. prepared CZTS thin films by thermal evaporation and the CZTS solar cells prepared by this method had a conversion efficiency of 2.3%. Katagiri et al. prepared CZTS thin films by RF sources co-sputtering followed by vapor phase sulfurization or by sulfurizing electron-beam-evaporated precursors and the efficiency of the resulted CZTS solar cell was 6.77%.

As described above, conventional methods for forming the CZTS solar cells usually utilize vacuum processes. However, vacuum processes are in general quite expensive and the cost of the CZTS solar cells is thus increased. Therefore, a solution process which does not require vacuum equipment is desired in order to reduce the manufacturing cost.

SUMMARY

An ink composition includes a solvent, a plurality of metal chalcogenide nanoparticles and at least one selected from the group consisted of metal ions and metal complex ions. The metal ions and/or metal complex ions are distributed on the surface of the metal chalcogenide nanoparticles and adapted to disperse the metal chalcogenide nanoparticles in the solvent. The metals of the metal chalcogenide nanoparticles, the metal ions and the metal complex ions are selected from a group consisted of group I, group II, group III and group IV elements of periodic table and include all metal elements of a chalcogenide semiconductor material.

An ink composition includes a solvent, a first means for forming metal chalcogenide cores in the solvent and a second means for dispersing the chalcogenide cores in the solvent. The first means and the second means include all metal elements of a chalcogenide semiconductor material which is selected from a group consisted of IV-VI, I-III-VI, and I-II-IV-VI compounds.

A method for forming an ink includes steps of forming metal chalcogenide nanoparticles, forming a solution containing at least one of metal ions and metal complex ions, mixing the solution with the metal chalcogenide nanoparticles, and repeating at least one of the metal chalcogenide nanoparticles forming step, the metal ions and/or metal complex ions forming step and the mixing step if metals of the metal chalcogenide nanoparticles, the metal ions and the metal complex ions do not include all metal elements of a chalcogenide semiconductor material. The metals of the metal chalcogenide nanoparticles, the metal ions and the metal complex ions are selected from group I, group II, group III or group IV of periodic table.

BRIEF DESCRIPTION OF THE DRAWINGS

The above and other objects, features and other advantages of the present application will be more clearly understood from the following detailed description taken in conjunction with the accompanying drawings, in which.

DETAILED DESCRIPTION

Definitions

Figure 1:
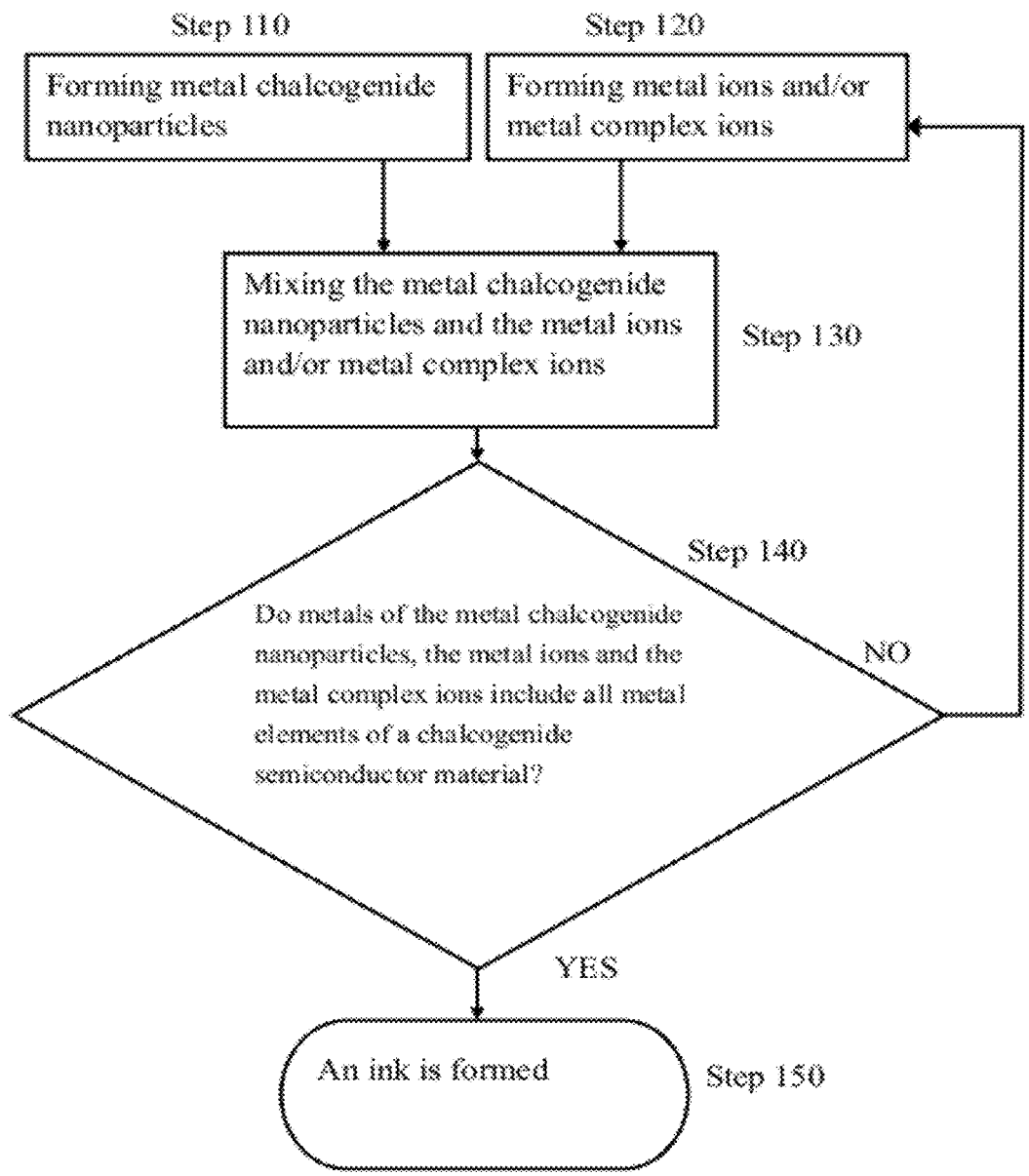
FIG. 1 is a flow chart of preparing an ink for forming a chalcogenide semiconductor film according to an embodiment of the present application.

The following definitions are provided to facilitate understanding of certain terms used herein and are not meant to limit the scope of the present disclosure.

"Chalcogen" refers to group VIA elements of periodic table. Preferably, the term "chalcogen" refers to sulfur and selenium.

"Chalcogenide compound" refers to a chemical compound containing at least one group VIA elements of periodic table.

"Chalcogenide semiconductor film", in a broad sense, refers to binary, ternary and quaternary chalcogenide compound semiconductor materials. Example of the binary chalcogenide compound semiconductor materials includes IV-VI compound semiconductor materials. The ternary chalcogenide compound semiconductor materials include compound semiconductor materials. The quaternary chalcogenide compound semiconductor materials include I-II-IV-VI compound semiconductor materials.

"IV-VI compound semiconductor material" refers to compound semiconductor materials composed of group IVA element and group VI element of periodic table, such as tin sulfide (SnS).

"I-III-VI compound semiconductor materials" refers to compound semiconductor materials composed of group IB element, group IIIA element and group VIA element of periodic table, such as CIS or CIGS.

"I-II-IV-VI compound semiconductor materials" refers to compound semiconductors composed of group IB element, group IIB element, group IVA element and group VIA element of periodic table, such as CZTS.

"CIS", in a broad sense, refers to compound semiconductor materials. Preferably, the term "CIS" refers a copper indium selenide compound of the formula: e.g. $CuIn(Se_xS_{1-x})_2$, wherein $0<x<1$. The term "CIS" further includes copper indium selenide compounds with fractional stoichiometries, e.g., $CuIn(Se_{0.65}S_{0.35})_2$.

"CZTS", in a broad sense, refers to I-II-IV-VI compound semiconductor materials. Preferably, the term "CZTS" refers a copper zinc tin sulfide/selenide compound of the formula: e.g. $Cu_a(Zn_{1-b}Sn_b)(Se_{1-c}S_c)_2$, wherein $0<a<1, 0<b<1, 0\leq c\leq 1$. The term "CZTS" further includes copper zinc tin sulfide/selenide compounds with fractional stoichiometries, e.g., $Cu_{1.94}Zn_{0.63}Sn_{1.3}S_4$. Further, I-II-IV-VI compound semiconductor materials include I-II-IV-IV-VI compound semiconductor materials, such as copper zinc tin germanium sulfide, and I-II-IV-IV-VI-VI compound semiconductor materials such as copper zinc tin germanium sulfide selenide.

"CIGS", in a broad sense, refers to compound semiconductor materials. In one embodiment of the present application, "CIGS" refers a copper indium gallium selenium compound of the formula, e.g., $CuIn_xGa_{1-x}Se_2$, where $0<x<1$. The term "CIGS" further includes copper indium gallium selenium compound with fractional stoichiometries, e.g., $Cu_{0.9}In_{0.7}Ga_{0.3}Se_2$.

"Ink" refers to a solution containing precursors which can form a semiconductor film. The term "ink" also refers to "precursor solution" or "precursor ink".

"Metal chalcogenide" refers to a compound composed of metal and group VI element of periodic table. Preferably, the term "metal chalcogenide" refers to binary, ternary and quaternary metal chalcogenide compounds.

"Ligand" refers to a molecular or an ion surrounding a central metal ion. A ligand can form a bonding, including chemical bonding and physical interaction, to the central metal ion to form a metal complex ion.

"Chalcogen-containing ligand" refers to ligands which include at least one group VI element of periodic table.

"Chalcogen-containing metal complex ion" refers to metal complex ions which include chalcogen-containing ligands.

"Chalcogen source" refers to compounds which can form metal chalcogenide with metals.

"Nanoparticle" refers to particles with a dimension ranged from about 2 nm to about 2000 nm.

Preparation of an Ink for Forming a Chalcogenide Semiconductor Film

Referring to FIG. 1, it is a flow chart of preparing an ink for forming a chalcogenide semiconductor film according to an embodiment of the present application.

The method includes a step 110 of forming metal chalcogenide nanoparticles. The metal chalcogenide nanoparticles can include only one kind of metal chalcogenide nanoparticle or more than one kind of metal chalcogenide nanoparticle. For example, the metal chalcogenide nanoparticles include a plurality of tin sulfide nanoparticles. In another example, the metal chalcogenide nanoparticles include tin sulfide nanoparticles and copper sulfide nanoparticles. The metal chalcogenide nanoparticles can include multi-nary metal chalcogenide nanoparticles, such as copper tin sulfide nanoparticles. Besides, the metal chalcogenide nanoparticles can include nanoparticles which each of them is constituted by at least two metal chalcogenides. For example, the at least two metal chalcogenides are selected from a group consisted of tin chalcogenide, zinc chalcogenide, copper chalcogenide, indium chalcogenide and gallium chalcogenide.

The process of forming metal chalcogenide nanoparticles includes: dissolving a metal salt in a solvent, such as water, to form a first aqueous solution, dissolving a chalcogen source in water to form a second aqueous solution and mixing the first aqueous solution with the second aqueous solution to form the metal chalcogenide nanoparticles. The process can further include a step of modifying a pH value of the mixed solution, a step of agitation or a heating step. In some embodiments, the mixed reaction solution is modified to a pH value from about 7 to about 14. The metal chalcogenide nanoparticle has a particle size ranged from about 2 nm to about 2000 nm.

The metal salt includes at least one metal selected from a group consisted of group IB, group IIB, group IIIB and group IVA of periodic table. In particular, the metal salt includes at least one metal selected from the group consisted of tin (Sn), cooper (Cu), zinc (Zn), germanium (Ge), indium (In) and gallium (Ga). The metal salt can be, for example, tin chloride, copper nitrate, zinc nitrate, gallium nitrate or indium chloride.

The chalcogen source include single or formulated precursors which is capable of generating sulfide ions or selenide ions in the solution and include sulfide- and selenide-containing compounds, such as, thioacetamide, thiourea, selenourea, hydrogen sulfide, hydrogen selenide, alkali metal sulfide or alkali metal selenide, selenium, sulfur, alkyl sulfide, alkylselenide and diphenyl sulfide.

The metal chalcogenide nanoparticles include, for example, tin sulfide (Sn—S), copper sulfide (Cu—S), zinc sulfide (Zn—S), indium sulfide (In—S), gallium sulfide (Ga—S), tin selenide (Sn—Se), copper selenide (Cu—Se), zinc selenide (Zn—Se), indium selenide (In—Se), gallium selenide (Ga—Se), copper tin sulfide (Cu—Sn—S), copper zinc sulfide (Cu—Zn—S), zinc tin sulfide (Zn—Sn—S), copper indium sulfide (Cu—In—S), copper gallium sulfide (Cu—Ga—S), copper indium gallium sulfide (Cu—In—Ga—S), copper tin selenide (Cu—Sn—Se), copper zinc selenide (Cu—Zn—Se), zinc tin selenide (Zn—Sn—Se), copper indium selenium (Cu—In—Se), copper gallium selenide (Cu—Ga—Se) and copper indium gallium selenide (Cu—In—Ga—Se). The use of hyphen ("—", e.g., in Cu—S, or Cu—Sn—S) indicates that the formula encompasses all possible combinations of those elements, such as "Cu—S" encompasses CuS and $Cu_2S$. The stoichiometry of metals and chalcogen can vary from a strictly molar ratio, such as 1:1 or 2:1. Further, fractional stoichiometries, such as $Cu_{1.8}S$ are also included.

Step 120 includes forming metal ions and/or metal complex ions. In step 120, either or both of metal ions and metal complex ions can be prepared. The metal ions can be formed of only one kind of metal ions, such as copper ions. In other examples, the metal ions can include more than one kind of metal ions, such as copper ions and zinc ions. Similarly, the metal complex ions can include one or more kinds of metal complex ions. The metals of the metal ions and the metal complex ions are selected from a group consisted of group IB, group IIB, group IIIB and group IVA of periodic table.

The metal ions can be prepared by dissolving a metal salt in a solvent, such as water.

The metal complex ions can be prepared by dissolving a metal salt in water to form metal ions in a first aqueous solution, dissolving a ligand in water to form a second aqueous solution, and mixing the first aqueous solution with the second aqueous solution to form metal complex ions. For example, the metal complex ions can be formed of chalcogen-containing metal complex ions. The chalcogen-containing metal complex ions can be prepared by mixing metal ions and chalcogen-containing ligands. The chalcogen-containing ligands include, for example, thioacetamide, thiourea, or ammonium sulfide. The chalcogen-containing metal complex ions include metal-thiourea ions, metal-thioacetamide ions, or metal-ammonium sulfide ions.

For example, the metal ions include copper ions, tin ions, zinc ions, germanium ions, indium ions or gallium ions. The metal complex ions include copper-thiourea ions, tin-thiourea ions, germanium-thiourea ions, copper-thioacetamide ions, tin-thioacetamide ions, germanium-thiourea ions, indium-thiourea ions, gallium-thiourea ions, indium-thioacetamide ions, and gallium-thioacetamide ions.

The metal-chalcogenide nanoparticles are present in the ink of an amount from about 1% (w/v) to about 80% (w/v). The metal ions and/or the metal complex ions are present in the ink of an amount from about 0.5% (w/v) to about 80% (w/v).

Step 130 includes mixing the metal chalcogenide nanoparticles with the metal ions and/or the metal complex ions.

It shall be noted that step 110 can be performed before, after or at the same time with step 120. That is, the metal chalcogenide nanoparticles can be prepared first and then the metal ions and/or metal complex ions are prepared. In another example, the metal ions and/or metal complex ions can be prepared first and then the metal chalcogenide nanoparticles are prepared. In other example, the metal chalcogenide nanoparticles and the metal ions and/or metal complex ions are prepared in the same step.

As mentioned above, both of metal chalcogenide nanoparticles and the metal ions and/or metal complex ions can include one or more metals. In order to prepare an ink for forming a chalcogenide semiconductor film, the metals of the metal chalcogenide nanoparticles and the metal ions and/or metal complex ions shall include all metal elements of a chalcogenide semiconductor material. For example, the chalcogenide semiconductor material is selected from a group consisted of IV-VI, I-III-VI, and I-II-IV-VI compounds. For example, for preparing the ink for forming a CZTS film, at least three metals, i.e., at least one group IB metal element, at least one group IIB metal element and at least one group IVA metal element of periodic table shall be included. In some examples, the at least three metals can be respectively used in steps 110 and 120 and are all included in the resulted solution of step 130. In other cases, the metal chalcogenide nanoparticles and the metal ions and/or metal complex ions may include only one metal respectively. Thus, only two metals are included in the resulted solution of step 130. Therefore, the method includes a step 140 of determining whether the metals of the metal chalcogenide nanoparticles and the metal ions and/or metal complex ions include all metals of a chalcogenide semiconductor material or not. If the all metals are not included, the afore-mentioned steps are repeated. For example, step 120 of forming metal ions and/or metal complex ions is repeated to include a third metal in the ink. In other example, step 110 of forming metal chalcogenide nanoparticles is repeated to include the third metal in the ink.

In step 150, an ink is formed.

In the above process, water is used as a solvent. However, in other embodiments, solvent includes polar solvents, such as alcohol, dimethyl sulfoxide (DMSO) or amines. Examples of alcohol include methanol, ethanol or isopropyl alcohol.

Besides, in some examples, steps 120 and step 130 can be repeated several times in order to add more metal ions and/or metal complex ions.

Figure 2:
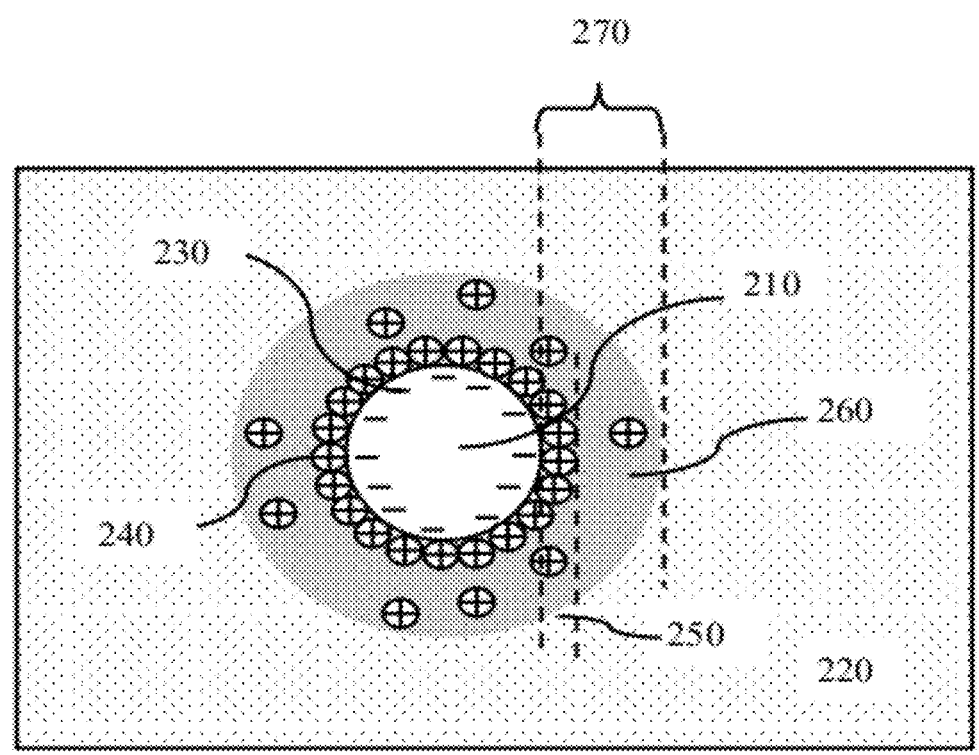
FIG. 2 is a schematic view of electron double layer theory.

In order to explain a characteristic of the ink of the present application, theory of electron double layer will be briefly described. FIG. 2 is a schematic view of electron double layer theory. In FIG. 2, a nanoparticle 210 is suspended in a solvent 220. The nanoparticle 210 has a negatively charged surface 230. Therefore, positive ions 240 are absorbed to a negatively charged surface 230 of the nanoparticle 210 by electrostatic force. Part of the positive ions 240 are densely absorbed to the negatively charged surface 230 and are named as stern layer 250 while part of the positive ions 240 are surrounding the stern layer 250 with a declining concentration and are named as diffuse layer 260. The stern layer 250 and the diffuse layer 260 constitute an electron double layer 270. Since the nanoparticles 210 are surrounded by the electron double layer 270, the nanoparticle 210 is repelled from another nanoparticle 210 with electrostatic repulsion force caused by the electron double layer 270. Hence, the nanoparticle 210 is able to be suspended in the solution 220.

Similarly, in this embodiment, the metal chalcogenide nanoparticles are also covered by the metal ions and/or metal complex ions and are thus suspended in the solvent. Therefore, the ink is a well dispersed particles and can be used to form a chalcogenide semiconductor film.

Hereinafter, several examples for preparing inks for forming a CZTS film and a CIGS film will be described.

Example 1

Preparation of an Ink for Forming a CZTS Film

Preparation of metal chalcogenide nanoparticles: 5 mmol of Tin chloride was dissolved in 25 ml of $H_2O$ to form an aqueous solution (A1). 4 mmol thioacetamide was dissolved in 40 ml of $H_2O$ to form an aqueous zsolution (B1). The aqueous solutions (A1) and (B1) were mixed to form a reaction solution (C1). The reaction solution (C1) was added with 12 ml of 30% $NH_4OH$ and stirred under 65° C. for 1.5 hour. The resulting brown-black precipitates were collected to provide tin sulfide (Sn—S) nanoparticles.

Preparation of metal complex ions: 7 mmol of copper nitrate was dissolved in 5 ml of $H_2O$ to form an aqueous solution (D1). 10 mmol of thioacetamide was dissolved in 5 ml of $H_2O$ to form an aqueous solution (E1). The aqueous solutions (D1) and (E1) were mixed to form a reaction solution (F1). The reaction solution (F1) was stirred under room temperature for 0.5 hours to form copper-thioacetamide ions.

The collected tin sulfide (Sn—S) nanoparticles were mixed with the reaction solution (F1) to form a mixture solution (G1).

Preparation of metal ions: 4.8 mmol of zinc nitrate was dissolved in 5 ml of $H_2O$ to form an aqueous solution (H1) containing zinc ions.

The aqueous solution (H1) was mixed with the mixture solution (G1) and stirred overnight to form an ink.

Figure 3:
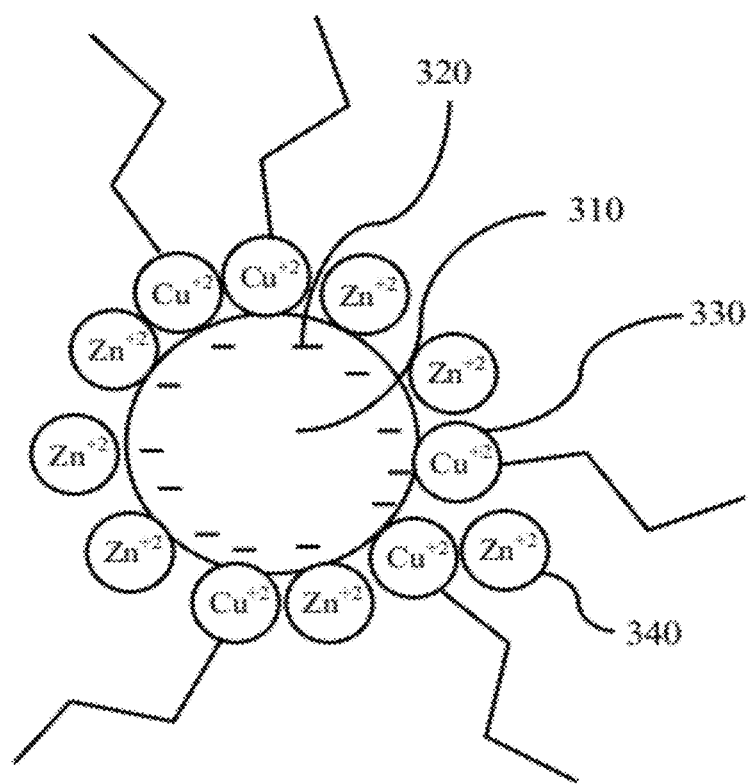
FIG. 3 is an enlarged view of a suspended metal chalcogenide nanoparticle of EXAMPLE 1.

FIG. 3 is an enlarged view of a suspended tin sulfide (Sn—S) nanoparticle of EXAMPLE 1. As shown in FIG. 3, the tin sulfide (Sn—S) nanoparticle 310 has a negatively charged surface 320. The copper-thioacetamide ions 330 and Zinc ions 340 both are positively charged, and are absorbed to the negatively charged surface 320 of the tin sulfide (SnS) nanoparticle 310 by electrostatic force.

Figure 4:
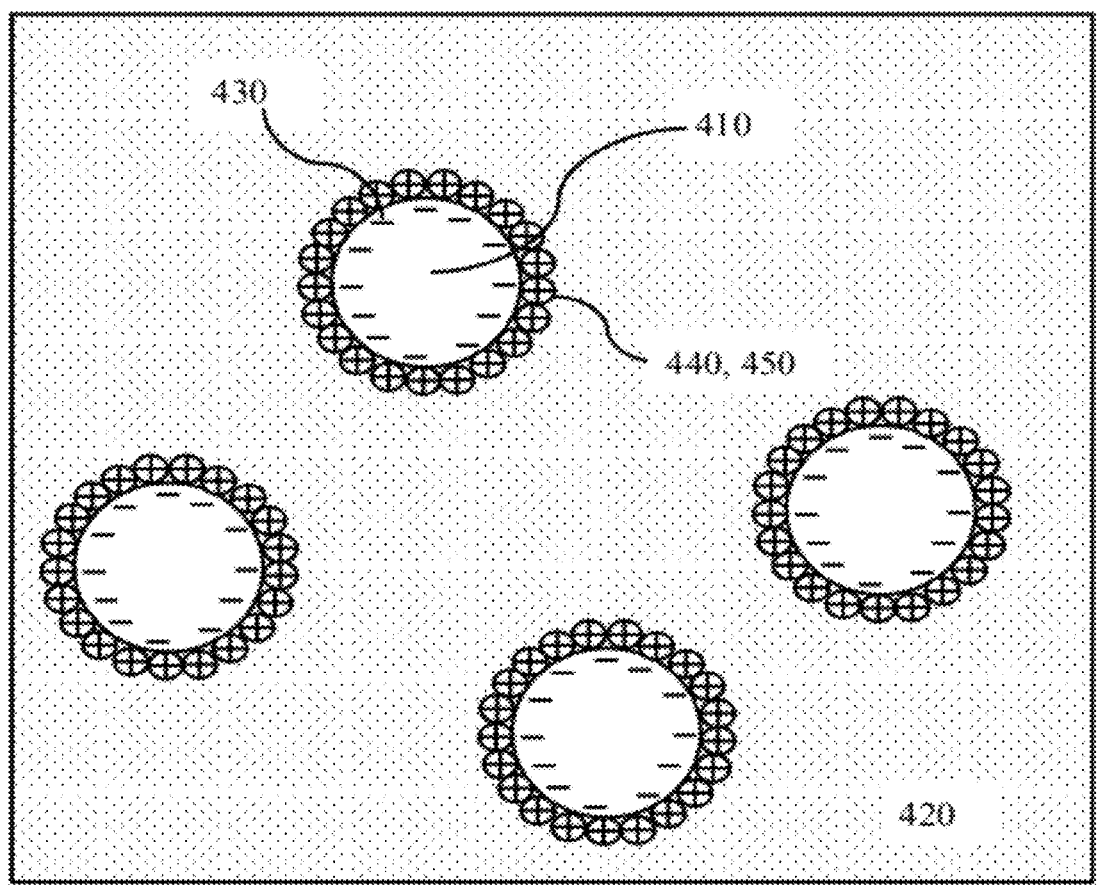
FIG. 4 is an enlarged view of a plurality of metal chalcogenide nanoparticles covered by electron double layers and suspended in the ink of EXAMPLE 1.

Also referring to FIG. 4, it is an enlarged view of a plurality of metal chalcogenide nanoparticles covered by electron double layers and suspended in the ink of EXAMPLE 1. In FIG. 4, there are a plurality of tin sulfide (Sn—S) nanoparticles 410 suspended in the solvent 420. Each of the SnS nanoparticles 410 has a negatively charged outer surface 430. Besides, there are copper-thioacetamide ions 440 and Zinc ions 450 are formed in the ink 420. The positively charged copper-thioacetamide ions 440 and Zinc ions 450 are absorbed to the negatively charged outer surface 430 of the tin sulfide (Sn—S) nanoparticles 410. Since each of the tin sulfide (Sn—S) nanoparticles 410 are surrounded by positive ions, they are repelled from each other. Therefore, the tin sulfide (Sn—S) nanoparticles 410 are dispersed and suspended in the solvent 420.

Since each of the tin sulfide (Sn—S) nanoparticles is covered by copper-thioacetamide ions and zinc ions, four elements of a quaternary compound semiconductor CZTS ($Cu_2ZnSnS_4$), i.e., copper, zinc, tin and sulfur, are close by each of the SnS nanoparticles. Thus, the ink is a well-mixture of copper, zinc, tin and sulfur and can be used to form a CZTS film.

Example 2

This example is different from EXAMPLE 1 in that there are two kinds of metal chalcogenide nanoparticles prepared in the ink, i.e., one with SnS nanoparticles and Cu complexes/ion, the other is ZnS nanoparticles.

Preparation of metal chalcogenide nanoparticles: 5 mmol of tin chloride was dissolved in 40 ml $H_2O$ to form an aqueous solution (A2). 4 mmol of thioacetamide was dissolved in 40 ml $H_2O$ to form an aqueous solution (B2). The aqueous solutions (A2) and (B2) were mixed to form a reaction solution (C2). The reaction solution (C2) was added with 10 ml of 30% $NH_4OH$ and stirred under 65° C. for 1.5 hour. Then, tin sulfide nanoparticles were precipitated as brown-black particles in the reaction solution (C2).

Preparation of metal complex ions and metal ions: 7 mmol of copper nitrate was dissolved in 5 ml of $H_2O$ to form an aqueous solution (D2). 5 mmol of thioacetamide was dissolved in 5 ml of $H_2O$ to form an aqueous solution (E2). The aqueous solution (D2) and (E2) were mixed to form a reaction solution (F2). The reaction solution (F2) was stirred under room temperature for 0.5 hours to form copper-thioacetamide ions and copper ions.

The tin sulfide nanoparticles were mixed with the reaction solution (F2) to form a mixture solution (G2).

Preparation metal ions: 4.8 mmol of zinc nitrate was dissolved in 5 ml of $H_2O$ to form an aqueous solution (H2) including zinc ions.

The mixture solution (G2) was mixed with the aqueous solution (H2) and stirred for 10 minutes to form a mixture solution (I2).

Formation of metal chalcogenide nanoparticles and the ink: 29 mmol of ammonium sulfide was added into the mixture solution (I2) and stirred overnight to form an ink.

Example 3

This example is different from EXAMPLE 2 in that the two kinds of metal chalcogenide nanoparticles are distributed with different composition of metal ions and/or metal complex ions.

Preparation of metal chalcogenide nanoparticles: 2.5 mmol of tin chloride were dissolved in 25 ml $H_2O$ to form an aqueous solution (A3). 2 mmol of thioacetamide were dissolved in 25 ml $H_2O$ to form an aqueous solution (B3). The aqueous solutions (A3) and (B3) were mixed to form a reaction solution (C3). The reaction solution (C3) was added with 10 ml of 30% $NH_4OH$ and stirred at 65° C. for 1.5 hour. Then, tin sulfide (Sn—S) nanoparticles were precipitated as brown-black particles in the reaction solution (C3).

Preparation of metal complex ions and metal ions: 3.8 mmol of copper nitrate was dissolved in 5 ml of $H_2O$ to form an aqueous solution (D3). 3 mmol of thioacetamide was dissolved in 5 ml of $H_2O$ to form an aqueous solution (E3). The aqueous solution (D3) and (E3) were mixed to form a reaction solution (F3). The reaction solution (F3) was stirred under room temperature for 0.5 hours to form copper-thioacetamide ions and copper ions.

The tin sulfide (Sn—S) nanoparticles were mixed with the reaction solution (F3) to form a mixture solution (G3).

Preparation metal ions and metal chalcogenide nanoparticles: 2.8 mmol of zinc nitrate was dissolved in 5 ml of $H_2O$ to form an aqueous solution (H3). 22 mmol of ammonium sulfide were dissolved in the aqueous solution (H3) to form a reaction solution (I3).

The mixture solution (G3) was mixed with the aqueous solution (I3) to form an ink.

Example 4

This example is different from EXAMPLE 1 in that nanoparticle precursors are formed before formation of the metal chalcogenide nanoparticles.

Preparation of nanoparticle precursors: 2.5 mmol of tin sulfide (Sn—S) and 2 mmol sulfur(S) were dissolved in 5 ml of 40~50% ammonium sulfide aqueous solution and stirred overnight to form a reaction solution (A4).

Preparation of metal complex ions and metal ions: 3.8 mmol of copper nitrate was dissolved in 2 ml of $H_2O$ to form an aqueous solution (B4). 4.0 mmol of thioacetamide was dissolved in 6 ml of $H_2O$ to form an aqueous solution (C4). The aqueous solution (B4) and the aqueous solution (C4) were mixed and stirred under room temperature for 20 minutes to form a reaction solution (D4). The aqueous solution (A4) was mixed with the reaction solution (D4) to form a mixture solution (E4).

Preparation of metal-ions: 2.8 mmol of zinc nitrate were dissolved in 2 ml of $H_2O$ to form an aqueous solution (F4).

The mixture solution (E4) was mixed with the aqueous solution (F4) and stirred overnight to form an ink.

Example 5

This example is different from EXAMPLE 4 in that copper-thiourea complex ions are formed in the ink.

Preparation of nanoparticle precursors: 2.5 mmol of Tin sulfide were dissolved in 5 ml of 40~50% thiourea aqueous solution and stirred over night to form a reaction solution (A5).

Preparation of metal complex ions and metal ions: 3.8 mmol of copper nitrate was dissolved in 5 ml of $H_2O$ to form an aqueous solution (B5). 5.9 mmol of thiourea was dissolved in 5 ml of $H_2O$ to form an aqueous solution (C5). The aqueous solution (B5) and the aqueous solution (C5) were mixed and stirred under room temperature for 20 minutes to form a reaction solution (D5).

The reaction solution (A5) was mixed with the reaction solution (D5) to form a mixture solution (E5).

Preparation of metal ions and metal chalcogenide nanoparticles: 2.8 mmol of zinc nitrate was dissolved in 2 ml of $H_2O$ to form an aqueous solution (F5). 33 mmol of ammonium sulfide were dissolved in the aqueous solution (F5) to form a reaction solution (G5).

The mixture solution (E5) was mixed with the reaction solution (G5) and stirred overnight to form an ink.

Example 6

This example is different from EXAMPLE 1 in that metal ions and/or metal complex ions are prepared before the formation of metal chalcogenide nanoparticles.

Preparation of first metal ions: 1.07 mmol tin chloride was dissolved in 2 ml of $H_2O$ and stirring for 5 minutes to form an aqueous solution (A6).

Preparation of second metal ions: 1.31 mmol zinc nitrate was dissolved in 2 ml of $H_2O$ to form an aqueous solution (B6).

The aqueous solution (A6) was mixed with the aqueous solution (B6) and stirred for 15 minutes to form an aqueous solution (C6).

Preparation of metal complex ions: 1.7 mmol of copper nitrate was dissolved in 1.5 ml of $H_2O$ to form an aqueous solution (D6). 3 mmol of thiourea was dissolved in 3 ml of $H_2O$ to form an aqueous solution (E6). The aqueous solution (D6) and the aqueous solution (E6) were mixed and stirred under room temperature for 20 minutes to form a reaction solution (F6).

The aqueous solution (C6) was mixed with the reaction solution (F6) and stirred for 10 minutes to form a mixture solution (G6). In some embodiments, the mixture solution (G6) can be stirred at a temperature of about 60° C.

Addition of metal chalcogenide nanoparticles and the ink: 1.5 ml of 4050% ammonium sulfide aqueous solution was added into the mixture solution (G6) and stirred overnight or sonication for 30 minutes to form an ink.

Example 7

This example is different from EXAMPLE 6 in that selenium is included in the ink.

Preparation of first metal ions: 1.07 mmol of tin chloride was dissolved in 2 ml of $H_2O$ and stirring for 5 minutes to form an aqueous solution (A7).

Preparation of second metal ions: 1.3 mmol of zinc nitrate was dissolved in 2 ml of $H_2O$ to form an aqueous solution (B7).

The aqueous solution (A7) was mixed with the aqueous solution (B7) and stirred for 15 minutes to form an aqueous solution (C7).

Preparation of metal complex ions: 1.7 mmol of was dissolved in 1.5 ml of $H_2O$ to form an aqueous solution (D7). 3 mmol of thiourea were dissolved in 3 ml of $H_2O$ to form an aqueous solution (E7). The aqueous solution (D7) and the aqueous solution (E7) were mixed and stirred under room temperature for 20 minutes to form a reaction solution (F7).

The aqueous solution (C7) was mixed with the reaction solution (F7) and stirred for 10 minutes to form a mixture solution (G7). In some embodiments, the mixture solution (G7) can be stirred at a temperature of about 60° C.

Formation of metal chalcogenide nanoparticles, metal complex ions and the ink: 0.1 g of selenium (Se) powder was dissolved in 1 ml of 4050% ammonium sulfide aqueous solution to form an aqueous solution (H7). The aqueous solution (H7) was added into the mixture solution (G7) and stirred overnight or sonication for 30 minutes to form an ink.

EXAMPLE 1 to EXAMPLE 7 are methods of preparing an ink for forming a CZTS film. Hereinafter, an example of preparing an ink for forming a CIGS film will be described.

Example 8

Preparation of an Ink for Forming a CIGS Film

Preparation of first metal ions: 0.5 mmol of gallium nitrate was dissolved in 2 ml of $H_2O$ to form an aqueous solution (A8).

Preparation of second metal ions: 0.5 mmol of indium chloride was dissolved in 2 ml of $H_2O$ to form an aqueous solution (B8).

The aqueous solution (A8) was mixed with the aqueous solution (B8) and stirred for 15 minutes to form an aqueous solution (C8).

Preparation of metal complex ions: 1.0 mmol of copper nitrate was dissolved in 2 ml of $H_2O$ to form an aqueous solution (D8). 5.9 mmol Thiourea was dissolved in 5 ml of $H_2O$ to form an aqueous solution (E8). The aqueous solution (D8) and the aqueous solution (E8) were mixed and stirred under room temperature for 20 minutes to form a reaction solution (F8).

The aqueous solution (C8) was mixed with the reaction solution (F8) and stirred for 10 minutes to form a mixture solution (G8). In some embodiments, the mixture solution (G8) can be stirred at a temperature of about 60° C.

Formation of metal chalcogenide nanoparticles and the ink: 1.5 ml of 40~50% ammonium sulfide aqueous solution was added into the mixture solution (G8) and stirred overnight or sonication for 30 minutes to form an ink.

Forming Chalcogenide Semiconductor Film by Using a Precursor Solution

Figure 5:
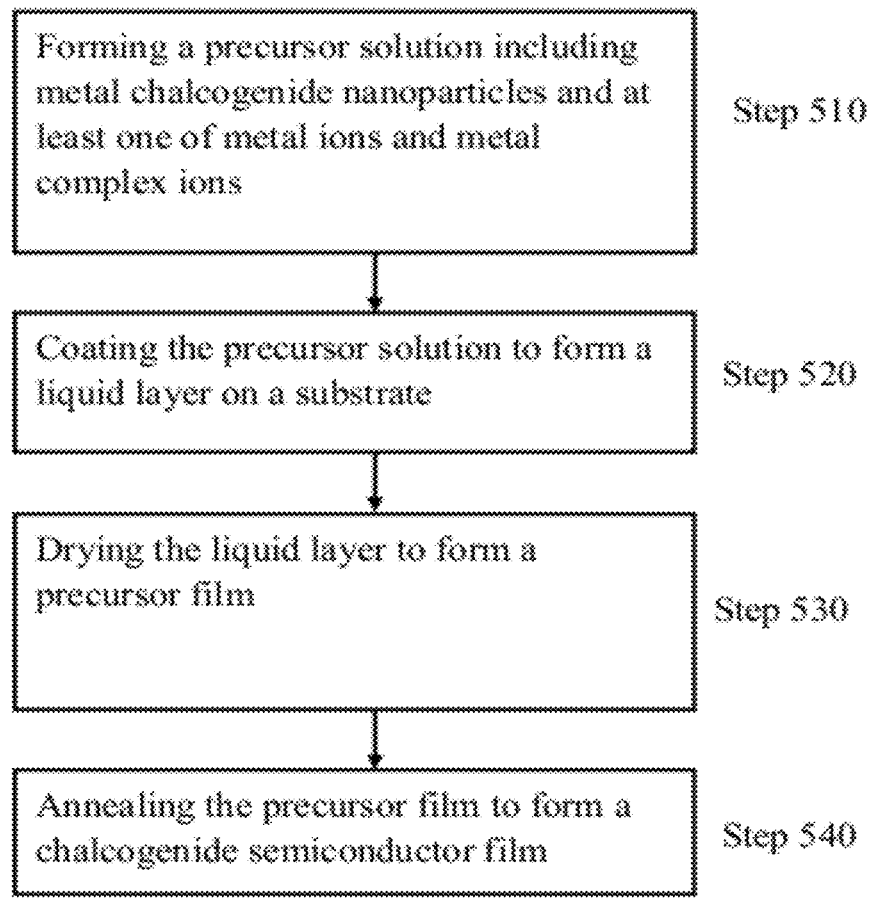
FIG. 5 is a flow chart of forming a chalcogenide semiconductor film according to an embodiment of the present application.
Figure 6:
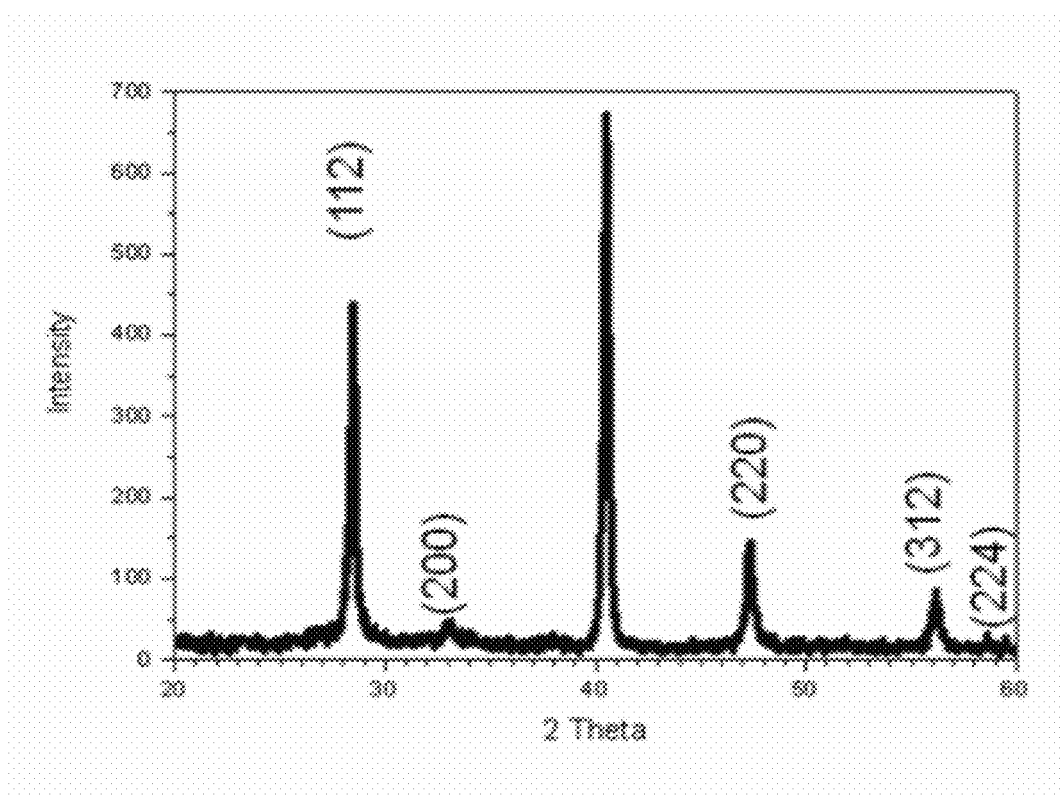
FIG. 6 to FIG. 10 are XRD analysis diagrams of the CZTS films by using the ink of EXAMPLE 1 to EXAMPLE 3 and EXAMPLE 6 to EXAMPLE 7.
Figure 7:
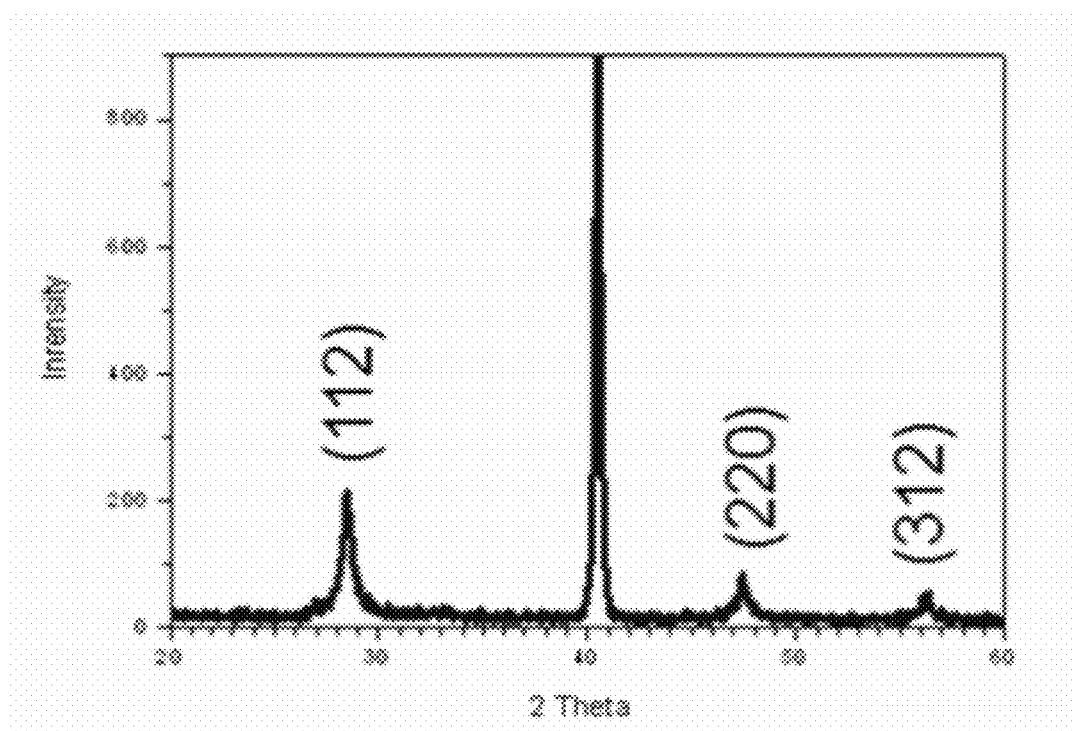
Figure 8:
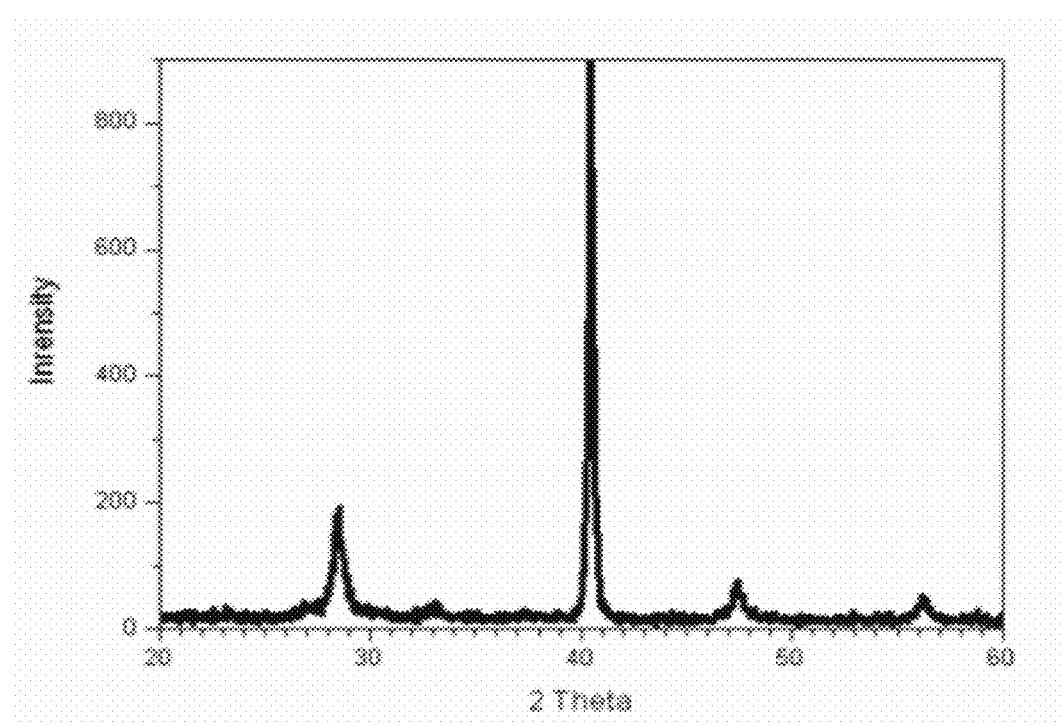
Figure 9:
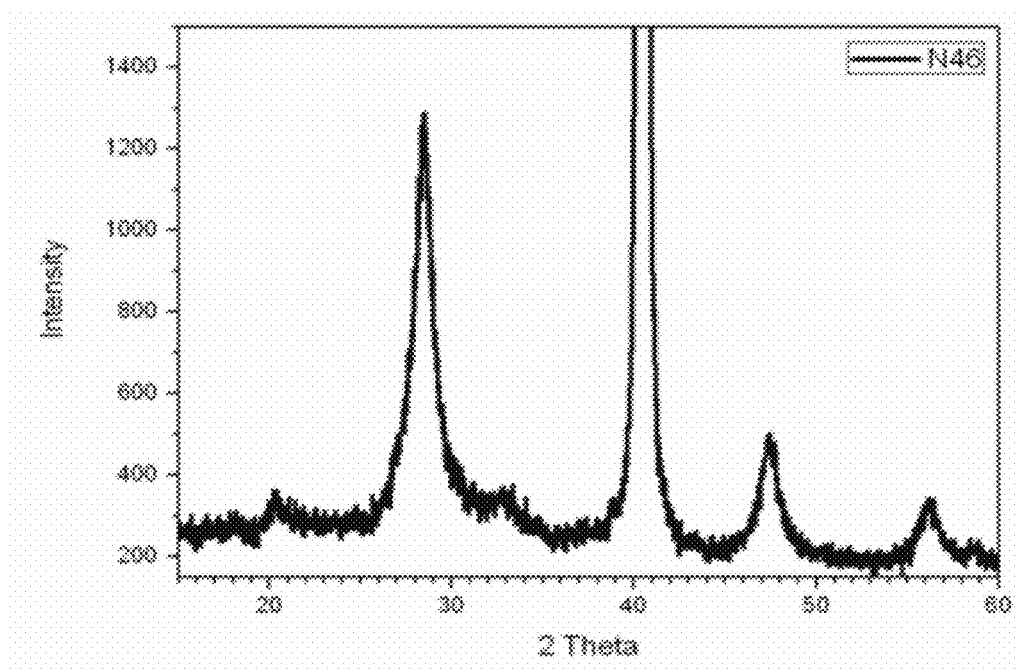
Figure 10:
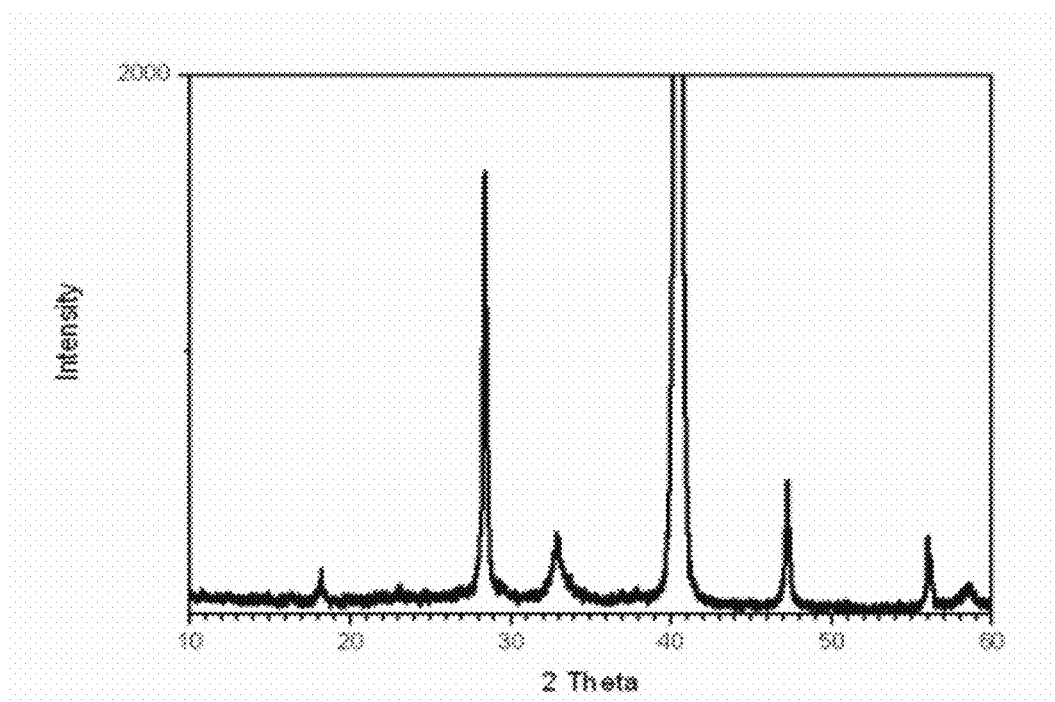

Referring to FIG. 5, it is a flow chart of forming a chalcogenide semiconductor film according to an embodiment of the present application.

The method includes a step 510 of preparing a precursor solution including metal chalcogenide nanoparticles and at least one of metal ions and metal complex ions. The precursor solution can be prepared by the process shown in FIG. 1.

Step 520 includes coating the precursor solution onto a substrate to form a liquid layer of the precursor solution on the substrate. The coating method can be, but not limited to, drop casting, spin coating, dip coating, doctor blading, curtain coating, slide coating, spraying, slit casting, meniscus coating, screen printing, ink jet printing, pad printing, flexographic printing or gravure printing. The substrate can be rigid, such as, glass substrate, or flexible, such as metal foil or plastic substrate. In some embodiments, the substrate is formed with a molybdenum (Mo) layer before coating the precursor solution.

Step 530 includes drying the liquid layer of the precursor solution to form a precursor film. During the drying process, the solvent is removed by evaporation. The drying method can be, for example, by placing the substrate in a furnace, an oven or on a hot plate. While the precursor solution of a CZTS film is used, the drying process can be carried out at a temperature from about 25° C. to 600° C., preferably, from 350° C. to 480° C. Most preferably, the drying temperature is about 425° C. The coating and drying steps can be repeated for more than one time, for example, from about 3 times to about 6 times. The resulted precursor film includes a thickness of about 1~5000 nm, for example.

Step 540 includes annealing the precursor film to form the chalcogenide semiconductor film. The annealing temperature of the precursor film of CZTS can be from about 300° C. to 700° C., preferably, from 480° C. to 650° C. Most preferably, the temperature is about 540° C. In this example, the annealing process can be carried out at a temperature of about 540° C. for 10 minutes. In some embodiments, the annealing process can be carried out under an atmosphere containing sulfur vapor.

The inks prepared in EXAMPLE 1 to EXAMPLE 3 and EXAMPLE 6 to EXAMPLE 7 were used as precursor solutions to form CZTS films. The CZTS films were confirmed to have a kesterite structure by XRD analysis as shown in FIG. 6~FIG. 10.

Fabrication of Photovoltaic Device

Figure 11:
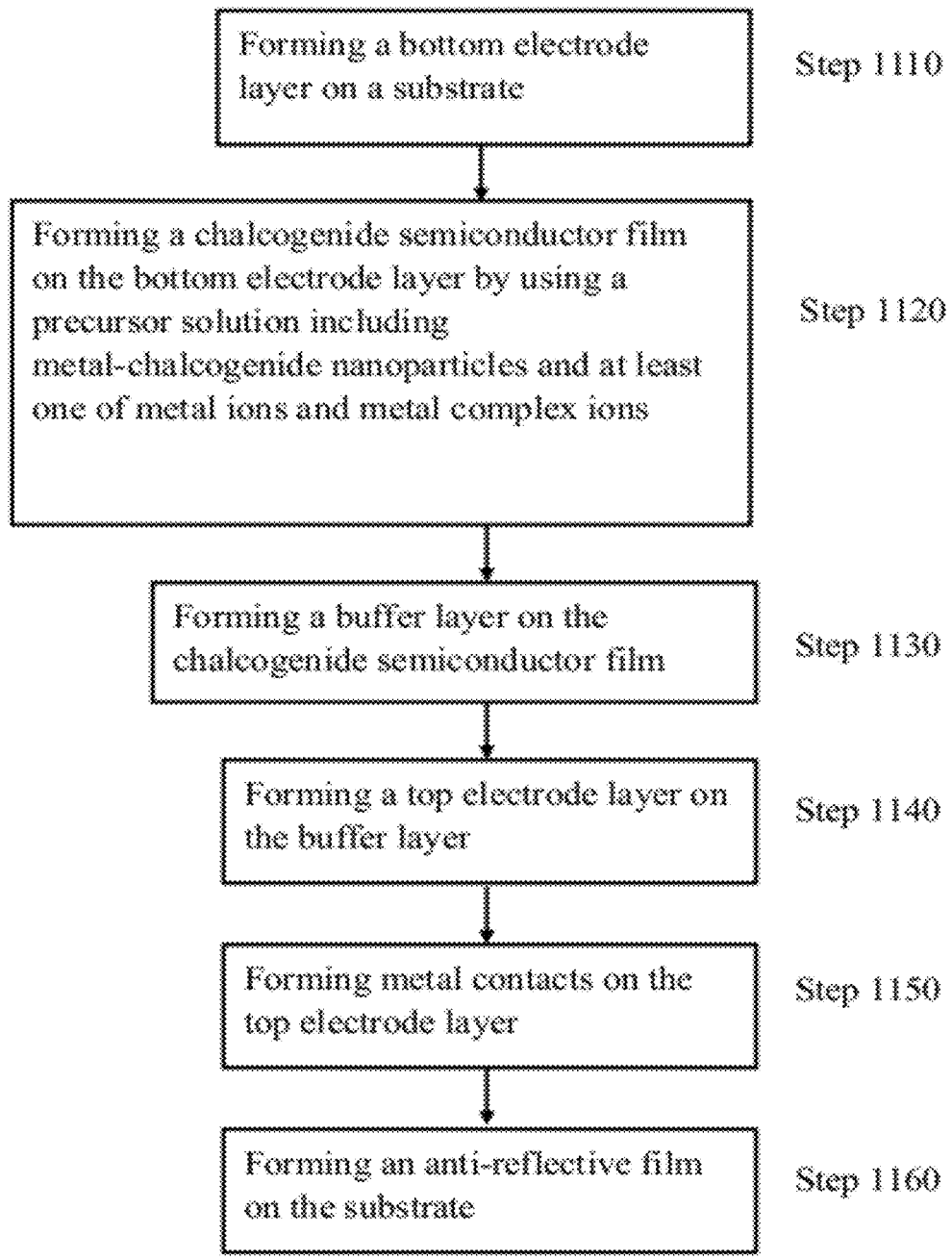
FIG. 11 is a flow chart of forming a photovoltaic device according to an embodiment of the present application.
Figure 12:
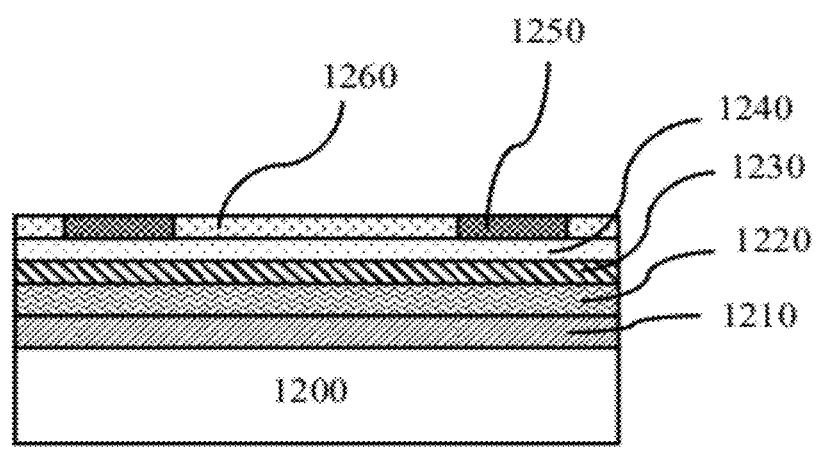
FIG. 12 is a schematic view of a photovoltaic device formed by the method shown in FIG. 11.

Referring to FIG. 11, it is a flow chart of forming a photovoltaic device according to an embodiment of the present application. Also referring to FIG. 12, it is a schematic view of a photovoltaic device formed by the method shown in FIG. 11.

The method includes a step 1110 of forming a bottom electrode layer 1210 on a substrate 1200. For example, the substrate 1200 includes a material selected from a group consisted of glass, metal foil and plastic. The bottom electrode layer 1210 includes a material selected from a group consisted of molybdenum (Mo), tungsten (W), aluminum (Al), and Indium Tin Oxide (ITO). In this embodiment, a Mo layer 1210 is formed on the substrate 1200 by sputtering.

Step 1120 includes forming a chalcogenide semiconductor film 1220 on the bottom layer 1210 by using a precursor solution. The precursor solution can be prepared by the process shown in FIG. 1. In this embodiment, a CZTS film is formed as the chalcogenide semiconductor film 1220. The CZTS film 1220 formed on the Mo layer 1210 includes a thickness from about 0.6 μm to about 6 μm.

Step 1130 includes forming a buffer layer 1230 on the chalcogenide semiconductor film 1220. The buffer layer includes a semiconductor layer, such as an n-type semiconductor layer or a p-type semiconductor layer. For example, the buffer layer includes a material selected from a group consisted of cadmium sulfide (CdS), Zn(O,OH,S), indium Sulfide ($In_2S_3$) zinc sulfide (ZnS), and zinc magnesium oxide ($Zn_xMg_{1-x}O$). In this embodiment, a CdS layer 1230 is formed as an n-type semiconductor layer on the CZTS film 1220. The CdS film 1230 can be formed by chemical bath deposition method. In this embodiment, the thickness of the CdS film 1230 can be, for example, about 20 nm to about 150 nm.

Step 1140 includes forming a top electrode 1240 layer on the buffer layer 1230. The top electrode includes a transparent conductive layer. For example, the top electrode layer 1240 includes a material selected from a group consisted of zinc oxide (ZnO), indium tin oxide (ITO), boron-doped zinc oxide (B—ZnO), aluminum-doped zinc oxide (Al—ZnO), gallium-doped zinc oxide (Ga—ZnO), and antimony tin oxide (ATO). In this embodiment, a zinc oxide (ZnO) film of a thickness of about 100 nm and an indium tin oxide film (ITO) of a thickness of about 130 nm are formed as the top electrode layer 1240 on the buffer layer 1230. The method for forming the ZnO film and the ITO film can be, for example, sputtering.

Step 1150 includes forming metal contacts 1250 on the top electrode layer 1240. The metal contacts 1250 can be formed of nickel (Ni)/aluminum (Al). The method of forming Ni/Al metal contacts 1250 can be, for example, electron-beam evaporation.

Step 1160 includes forming an anti-reflective film 1260 on the substrate 1200. For example, the anti-reflective film includes a material selected from a group consisted of magnesium fluoride ($MgF_2$), silicon oxide ($SiO_2$), silicon nitride ($Si_3N_4$) and Niobium oxide ($NbO_x$). In this embodiment, a $MgF_2$ film 1260 is formed on the substrate as the anti-reflective film. The $MgF_2$ film can be formed by, for example, electron-beam evaporation. In this embodiment, the thickness of the magnesium fluoride ($MgF_2$) film can be, for example, 110 nm. Then, a photovoltaic device is formed.

Figure 13:
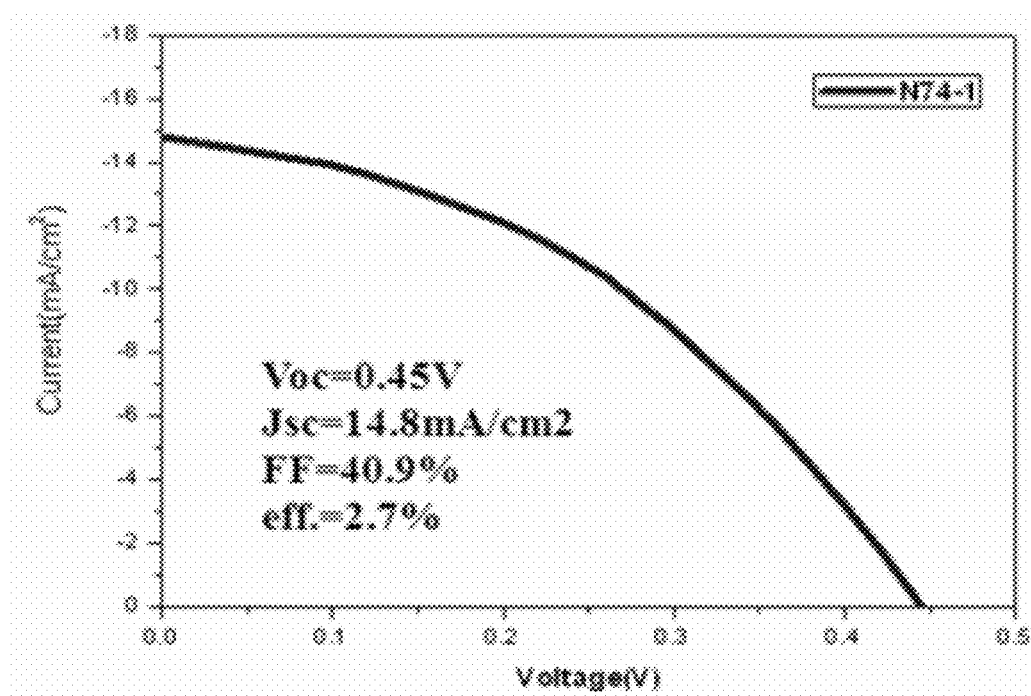
FIG. 13 is a J-V diagram of a photovoltaic device formed with a CZTS film by using the ink of EXAMPLE 7.

FIG. 13 is a J-V diagram of a photovoltaic device formed with a CZTS film by using the ink of EXAMPLE 7. The device was measured to have power conversion efficiency of 2.7%, under 1.5 AM standard illumination conditions with open circuit voltage (Voc)=450 mV, fill factor (FF)=40.9% and short circuit current density (Jsc)=14.8 mA/cm$^2$.

What is claimed is:

1. An ink composition, comprising:
    a solvent;
    a plurality of metal chalcogenide nanoparticles; and
    at least one selected from the group consisted of metal ions and metal complex ions which are distributed on the surface of the metal chalcogenide nanoparticles to form an electron double layer and adapted to disperse the metal chalcogenide nanoparticles in the solvent;
    wherein metals of the metal chalcogenide nanoparticles, the metal ions and the metal complex ions are selected from a group consisted of group I, group II, group III and group IV elements of periodic table and include all metal elements of a chalcogenide semiconductor material.

2. The ink composition according to claim 1, wherein the chalcogenide semiconductor material is selected from a group consisted of IV-VI, I-III-VI and I-II-IV-VI compounds.

3. The ink composition according to claim 1, wherein at least two of the metal chalcogenide nanoparticles are distributed with different metal ions and/or metal complex ions.

4. The ink composition according to claim 1, wherein the metal chalcogenide nanoparticles include at least two different metal chalcogenide.

5. The ink composition according to claim 1, wherein the metal chalcogenide nanoparticles include one nanoparticle constituted by at least two metal chalcogenides.

6. The ink composition according to claim 5, wherein the at least two metal chalcogenides are selected from a group consisted of tin chalcogenide, zinc chalcogenide and copper chalcogenide.

7. The ink composition according to claim 5, wherein the at least two metal chalcogenides are selected from a group consisted of copper chalcogenide, indium chalcogenide and gallium chalcogenide.

8. The ink composition according to claim 1, wherein metals of the metal chalcogenide nanoparticles, the metal ions and the metal complex ions include tin, copper and zinc.

9. The ink composition according to claim 1, wherein metals of the metal chalcogenide nanoparticles, the metal ions and the metal complex ions further include germanium.

10. The ink composition according to claim 1, wherein metals of the metal chalcogenide nanoparticles, the metal ions and the metal complex ions include copper, indium and gallium.

11. The ink composition according to claim 1, wherein the solvent includes polar solvents.

12. The ink composition according to claim 1, wherein the solvent includes at least one selected from the group consisted of water, methanol, ethanol and isopropyl alcohol, dimethyl sulfoxide (DMSO) and amines.

13. The ink composition according to claim 1, wherein the metal chalcogenide nanoparticles includes at least one selected from the group consisted of Sn—S, Cu—S, Zn—S, In—S, Ga—S, Sn—Se, Cu—Se, Zn—Se, In—Se, Ga—Se, CuSn—S, Cu—Zn—S, Zn—Sn—S, Cu—In—S, Cu—In—

Ga—S, Cu—Sn—Se, Cu—Zn—Se, Zn—Sn—Se, Cu—In—Se, Cu—Ga—S, Cu—Ga—Se, and Cu—In—Ga—Se.

14. The ink composition according to claim 1, wherein the metal ions includes at least one selected from a group consisted of copper ions, tin ions, zinc ions, germanium ions, indium ions and gallium ions.

15. The ink composition according to claim 1, wherein the metal complex ions include at least one selected from the group consisted of metal-thiourea ions, metal-thioacetamide ions and metal-ammonium sulfide ions.

16. The ink composition according to claim 15, wherein the metal thiourea complex ions include at least one selected from the group consisted of copper-thiourea ions, tin-thiourea ions, zinc-thiourea ions, germanium-thiourea ions, indium-thiourea ions and gallium-thiourea ions.

17. The ink composition according to claim 15, wherein the metal-thioacetamide ion includes at least one selected from the group consisted of copper-thioacetamide ions, tin-thioacetamide ions, zinc-thioacetamide ions, germanium-thioacetamide ion, indium-thioacetamide ions, and gallium-thioacetamide ions.

18. The ink composition according to claim 1, wherein the metal chalcogenide nanoparticle has a particle size ranged from about 2 nm to about 2000 nm.

* * * * *